(12) United States Patent
Hong

(10) Patent No.: US 11,264,080 B1
(45) Date of Patent: Mar. 1, 2022

(54) SEMICONDUCTOR DEVICE AND METHOD FOR OPERATING THE SAME

(71) Applicant: SK hynix Inc., Gyeonggi-do (KR)

(72) Inventor: Yun Gi Hong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/151,423

(22) Filed: Jan. 18, 2021

(30) Foreign Application Priority Data

Sep. 1, 2020 (KR) .................... 10-2020-0110996

(51) Int. Cl.
| | |
|---|---|
| *G11C 11/40* | (2006.01) |
| *G11C 11/408* | (2006.01) |
| *G11C 5/14* | (2006.01) |
| *G11C 29/50* | (2006.01) |
| *G11C 29/12* | (2006.01) |

(52) U.S. Cl.
CPC .......... *G11C 11/4085* (2013.01); *G11C 5/148* (2013.01); *G11C 29/50* (2013.01); *G11C 2029/1202* (2013.01)

(58) Field of Classification Search
CPC . G11C 11/4064; G11C 11/4093; G11C 5/148; G11C 29/50
See application file for complete search history.

(56) References Cited

U.S. PATENT DOCUMENTS

| | | | |
|---|---|---|---|
| 9,704,567 B1 * | 7/2017 | Kugel | G11C 29/00 |
| 2003/0063509 A1 | 4/2003 | Yamasaki | |
| 2017/0249976 A1 * | 8/2017 | Bringivijayaraghavan | G11C 11/419 |

FOREIGN PATENT DOCUMENTS

KR  10-1027338  4/2011

* cited by examiner

*Primary Examiner* — Han Yang
(74) *Attorney, Agent, or Firm* — IP & T Group LLP

(57) ABSTRACT

According to an embodiment, a semiconductor device includes a transmission circuit including first and second transistors coupled in series between a first voltage terminal and a second voltage terminal, and a first common node coupled between the first and second transistors and coupled to a through line, the transmission circuit outputting a signal transferred from an internal circuit to the first common node according to an output control signal; a reception circuit including third and fourth transistors coupled in series between the first voltage terminal and the second voltage terminal, and a second common node coupled between the third and fourth transistors and coupled to the internal circuit, the reception circuit transferring a signal transferred through the through line to the internal circuit according to a first input control signal; and a deterioration acceleration circuit for applying stress to the first and third transistors according to a test signal.

21 Claims, 10 Drawing Sheets

SEMICONDUCTOR DEVICE AND METHOD FOR OPERATING THE SAME

CROSS-REFERENCE TO RELATED APPLICATION

The present application claims priority under 35 U.S.C. § 119 on Korean Patent Application No. 10-2020-0110996, filed on Sep. 1, 2020, which is herein incorporated by reference in its entirety.

BACKGROUND

1. Field

The disclosure relates to semiconductor design technology, and specifically to semiconductor devices including an unused circuit.

2. Description of the Related Art

Recently, multi-chip packaging has been proposed as technology for packaging semiconductor devices. Multi-chip packaging technology composes a plurality of semiconductor chips into one package. There are different types of packages, i.e., single die package (SDP), double die package (DDP), and quad die package (QDP), depending on how many semiconductor chips are included in one package. A product family capable of supporting various specifications with a single development model may be developed by implementing various configurations in a single semiconductor chip for cost saving purposes. For example, one semiconductor chip may be developed for a multi-chip package, and a fuse option method may be used to determine which one of the SDP, DDP, and QDP is to be applied to the semiconductor chip.

However, as various configurations are implemented in one semiconductor chip, net-die and current loss may occur. For example, when SDP, DDP and QDP-types are developed as a single semiconductor chip, transmission/reception circuitry for through silicon vias (TSV, and also referred to as through electrode(s)), which are unnecessary for the SDP and DDP types, are implemented in the semiconductor chip. Therefore, the transmission/reception circuitry for through electrodes implemented in the SDP and DDP-type semiconductor chip always remain in the idle state and may increase the off current (i.e., the leakage current of the transistor) in the SDP and DDP-type semiconductor chip. Resultantly, the power consumption of the product may increase. In particular, since the transmission/reception circuitry for the through electrodes use bulky drivers in the form of an array in the transmission circuit and the reception circuit, the off-current may be further increased.

SUMMARY

According to embodiments, there are provided a semiconductor device capable of reducing the off-current of a circuit operating in an idle state without being used according to the configuration, and a test operation method thereof.

According to an embodiment, a semiconductor device includes a transmission circuit including a first transistor and a second transistor coupled in series between a first voltage terminal and a second voltage terminal, and a first common node coupled between the first transistor and the second transistor and coupled to a through line, the transmission circuit outputting a signal transferred from an internal circuit to the first common node according to an output control signal; a reception circuit including a third transistor and a fourth transistor coupled in series between the first voltage terminal and the second voltage terminal, and a second common node coupled between the third transistor and the fourth transistor and coupled to the internal circuit, the reception circuit transferring a signal transferred through the through line to the internal circuit according to a first input control signal; and a deterioration acceleration circuit for applying stress to the first and third transistors according to a test signal.

According to an embodiment, a semiconductor device includes a first pull-up transistor and a first pull-down transistor coupled to a through line by a first common node and receiving a driving control signal transferred from a first global line or a second global line according to an output control signal to drive the first common node; a second pull-up transistor and a second pull-down transistor coupled to the first global line by a second common node and receiving a signal transferred through the through line according to a first input control signal to drive the second common node; a third pull-up transistor and a third pull-down transistor coupled to the second global line through a third common node and receiving a signal transferred through the through line according to a second input control signal to drive the third common node; and a deterioration acceleration circuit for applying stress to the first to third pull-up transistors according to a test signal.

According to an embodiment, a method for operating a semiconductor device includes driving a first common node coupling a first pull up transistor and a first pull down transistor and also coupled to a through line, receiving a signal transferred through the through line, and driving a second common node coupling a second pull up transistor and a second pull down transistor and also coupled to a first global line, and receiving a signal transferred through the through line and driving a third common node coupling a third pull up transistor and a second pull down transistor and also coupled to a second global line; performing a deterioration acceleration operation for controlling to apply a stress to the first to third pull-up transistors during a test operation; and driving the first to third common nodes at a ground voltage level during a normal operation.

According to an embodiment, a semiconductor device includes a transmission circuit including a first transistor and a second transistor coupled in series between a first voltage terminal and a second voltage terminal and having a first common node coupled to a scheduled line and outputting a signal, transferred from an internal circuit, to the first common node according to an output control signal, and a deterioration acceleration circuit for controlling to apply a stress to only one of the first transistor and the second transistor according to a test signal.

According to an embodiment, a semiconductor device includes a first driving circuit including a first transistor and a second transistor coupled in series between a first voltage terminal and a second voltage terminal, and a first common node coupled between the first transistor and the second transistor and coupled to a scheduled line, the first driving circuit transferring data transferred from a first pad group to the scheduled line according to a first driving control signal; a second driving circuit including a third transistor and a fourth transistor coupled in series between the first voltage terminal and the second voltage terminal, and a second common node coupled between the third transistor and the fourth transistor and coupled to a scheduled line, the second driving circuit transferring data transferred from a second pad group to the scheduled line according to a second driving control signal; and a deterioration acceleration circuit for applying a stress to the third transistor according to a test signal.

According to an embodiment, a semiconductor device includes an internal circuit; first and second global lines; a through line; a transmission circuit including a first pull-up transistor and a first pull-down transistor coupled in series between a power supply voltage terminal and a ground voltage terminal and a first common node coupled between the first pull-up and pull-down transistors, the transmission circuit being coupled to the internal circuit through the first global line, coupled to the through line by the first common node, the transmission circuit outputting a signal received from the internal circuit to the first common node according to a first control signal; a reception circuit including a second pull-up transistor and a second pull-down transistor coupled in series between the power supply voltage terminal and the ground voltage terminal and a second common node coupled between the second pull-up pull-down transistors, the reception circuit being coupled to the through line and coupled to the internal circuit by the second global line, the reception circuit transferring a signal received through the through line to the internal circuit through the second global line according to a second control signal; and a deterioration acceleration circuit configured to: control the first and second control signals according to enabling of a test signal such that the first and second pull-up transistors are turned on and stress is applied to the first and second pull-up transistors, and control the first and second control signals according to disabling of the test signal such that the first and second common nodes are at a ground voltage level.

According to embodiments, the semiconductor device may reduce the off-current caused by unused circuit(s) by accelerating the deterioration of certain types of transistors among unused circuit(s) when various configurations are implemented in one semiconductor chip.

DETAILED DESCRIPTION

Figure 1:
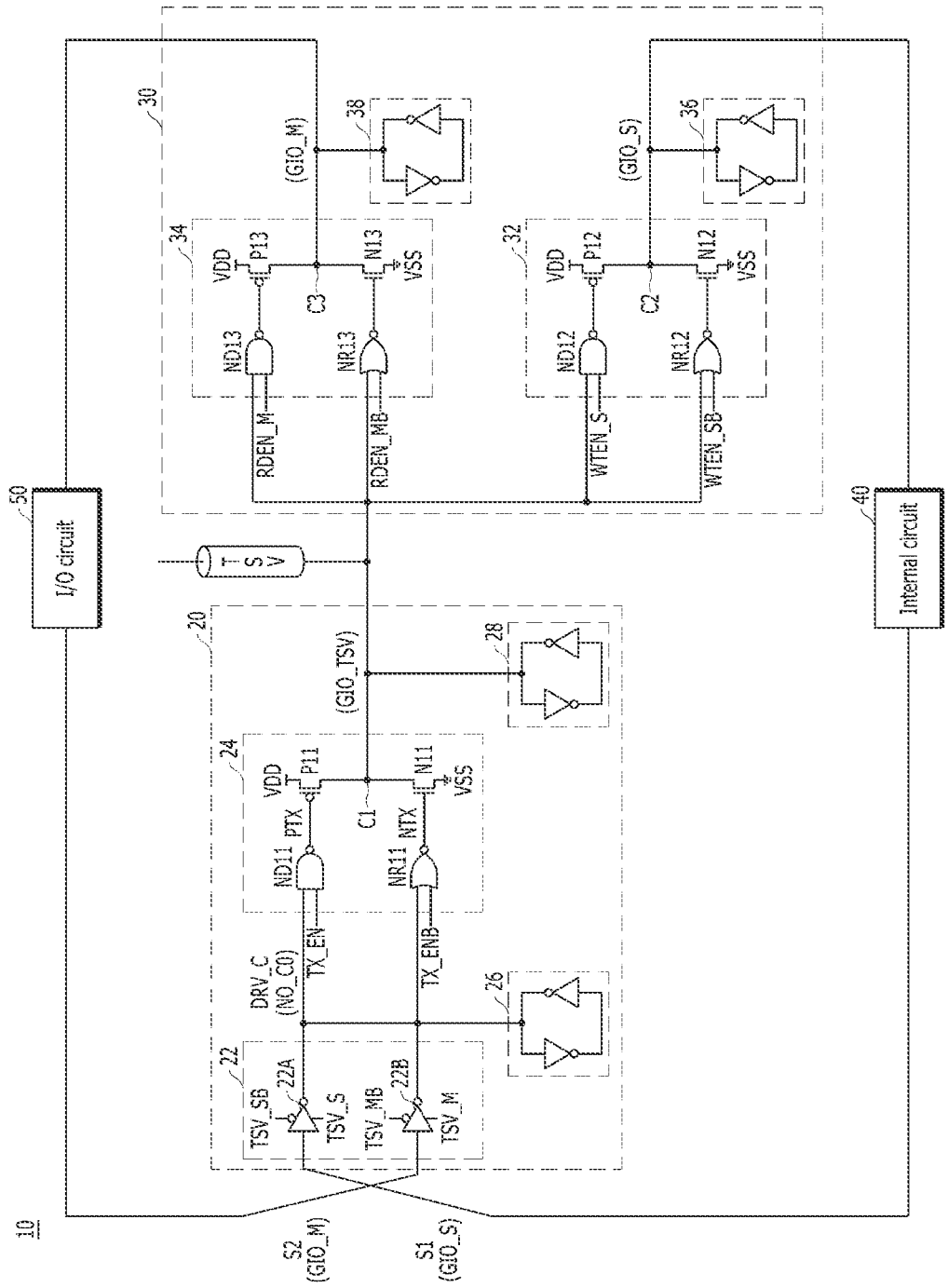
FIG. 1 is a diagram illustrating a configuration of a semiconductor device.

Hereinafter, embodiments of the disclosure are described below in detail with reference to the accompanying drawings to allow one of ordinary skill in the art to readily practice the technical spirit of the disclosure. In describing embodiments of the disclosure, well known information may be omitted from the description. In assigning reference denotations to the elements in the drawings, the same or substantially the same reference denotations may be used to refer to the same or substantially the same elements throughout the specification and the drawings. Throughout the specification, reference to "an embodiment" or the like is not necessarily to only one embodiment, and different references to any such phrase are not necessarily to the same embodiment(s). The term "embodiment" when used herein does not necessarily refer to all embodiments.

FIG. 1 is a diagram illustrating a configuration of a semiconductor device 10.

Referring to FIG. 1, the semiconductor device 10 may include at least one through electrode TSV, a transmission circuit 20, and a reception circuit 30 corresponding to the through electrode TSV. By way of example, FIG. 1 shows that the semiconductor device 10 includes one through electrode but, in practice, the semiconductor device 10 may include a plurality of through electrodes and transmission circuits and reception circuits individually corresponding to the through electrodes.

The transmission circuit 20 may include a driving control circuit 22 and a driving circuit 24. The driving control circuit 22 may selectively receive a first transmission signal S1 from a first global line GIO_S or a second transmission signal S2 from a second global line GIO_M according to master/slave selection signals TSV_S and TSV_M and transmit the received signal, as a driving control signal DRV_C, to a control node NO_C0. When the semiconductor device 10 is implemented as a quad die package (QDP)-type chip or a 3-Dimensional Stacked (3DS) semiconductor chip, the master/slave selection signals TSV_S and TSV_M are signals to distinguish between a master chip and a slave chip. That is, the master/slave selection signals may be divided into a master selection signal TSV_M that is enabled when the semiconductor device 10 operates as the master chip and a slave selection signal TSV_S that is enabled when the semiconductor device 10 operates as a slave chip.

When an output control signal TX_EN is enabled at a logic high level, the driving circuit 24 may drive a through line GIO_TSV connected to one end of the through electrode TSV according to the driving control signal DRV_C. When the output control signal TX_EN is disabled at a logic low level, the driving circuit 24 may maintain the through line GIO_TSV in a floating state. The output control signal TX_EN is enabled to activate the transmission circuit 20.

More specifically, the driving control circuit 22 may include a first buffer 22A and a second buffer 22B. Each of the first buffer 22A and the second buffer 22B may be implemented as an inverter. Outputs of the first buffer 22A and the second buffer 22B may be commonly connected to the control node NO_C0. When the slave selection signal TSV_S is enabled at a logic high level, the first buffer 22A may invert and buffer the first transmission signal S1 from the first global line GIO_S and output the resultant signal to the control node NO_C0. The first buffer 22A may block the input of the first transfer signal S1 when the slave selection signal TSV_S is disabled at a logic low level. When the master selection signal TSV_M is enabled at a logic high level, the second buffer 22B may invert and buffer the second transmission signal S2 from the second global line GIO_M and output the resultant signal to the control node NO_C0. The second buffer 22B may block the input of the second transfer signal S2 when the master selection signal TSV_M is disabled at a logic low level.

The driving circuit 24 may include a first NAND gate ND11, a first NOR gate NR11, a pull-up transistor P11, and a pull-down transistor N11. The first NAND gate ND11 may perform a logic NAND operation on the output control signal TX_EN and the driving control signal DRV_C and output a pull-up driving signal PTX. The first NOR gate NR11 may perform a logic NOR operation on the inverted signal TX_ENB of the output control signal TX_EN and the driving control signal DRV_C and output a pull-down driving signal NTX. The pull-up transistor P11 may drive the through line GIO_TSV at a power supply voltage (VDD) level according to the pull-up driving signal PTX. The pull-down transistor N11 may drive the through line GIO_TSV at a ground voltage (VSS) level according to the pull-down driving signal NTX. In some embodiments, the pull-up transistor P11 may be configured as a PMOS transistor, and the pull-down transistor N11 may be configured as an NMOS transistor. With the above configuration, when the output control signal TX_EN is enabled at a logic high level and the driving control signal DRV_C is at a logic high level, the driving circuit 24 may drive the through line GIO_TSV at a power supply voltage VDD. When the output control signal TX_EN is enabled at a logic high level and the driving control signal DRV_C is at a logic low level, the driving circuit 24 may drive the through line GIO_TSV at a ground voltage (VSS) level.

The transmission circuit 20 may further include a first latch circuit 26 and a second latch circuit 28. Each of the first latch circuit 26 and the second latch circuit 28 may include two inverters connected in series. The first latch circuit 26 may latch a signal of the control node NO_C0 (i.e., the driving control signal DRV_C) to maintain the logic level. The second latch circuit 28 may latch a signal of the through line GIO_TSV to maintain the logic level.

The reception circuit 30 may include a first receiver 32 and a second receiver 34. The first receiver 32 may drive the first global line GIO_S using the signal of the through line GIO_TSV according to a first input control signal WTEN_S. The first receiver 32 may drive the first global line GIO_S according to the signal of the through line GIO_TSV when the first input control signal WTEN_S is enabled at a logic high level. When the first input control signal WTEN_S is disabled at a logic low level, the first receiver 32 may maintain the first global line GIO_S in a floating state. The second receiver 34 may drive the second global line GIO_M using the signal of the through line GIO_TSV according to a second input control signal RDEN_M. The second receiver 34 may drive the second global line GIO_M according to the signal of the through line GIO_TSV when the second input control signal RDEN_M is enabled at a logic high level. When the second input control signal RDEN_M is disabled at a logic low level, the second receiver 34 may maintain the second global line GIO_M in a floating state. Each of the first receiver 32 and the second receiver 34 is substantially the same in configuration as the driving circuit 24.

The reception circuit 30 may further include a third latch circuit 36 and a fourth latch circuit 38. Each of the third latch circuit 36 and the fourth latch circuit 38 may include two inverters connected in series. The third latch circuit 36 may latch the signal of the first global line GIO_S, maintaining the logic level. The fourth latch circuit 38 may latch the signal of the second global line GIO_M, maintaining the logic level.

Figure 2A:
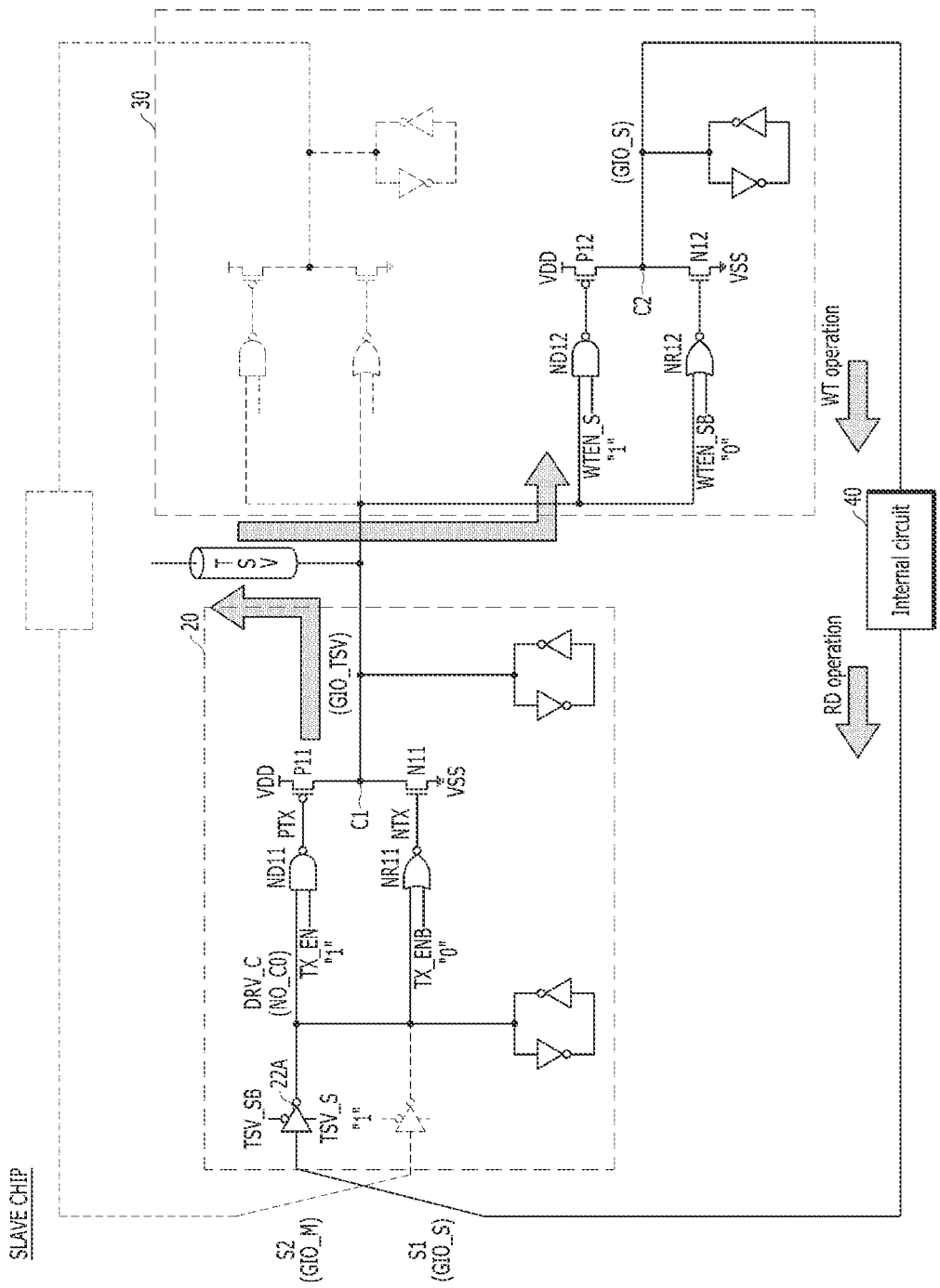
FIGS. 2A and 2B are diagrams describing write and read operations when the semiconductor device of FIG. 1 is a slave chip and a master chip, respectively.

The first receiver 32 of the reception circuit 30 and the first buffer 22A of the transmission circuit 20 may be connected to an internal circuit 40 through the first global line GIO_S. When the semiconductor device 10 is a memory device, the internal circuit 40 may include banks of the memory device. Referring to FIG. 2A, when the semiconductor device 10 is a slave chip, the first input control signal WTEN_S and the slave selection signal TSV_S may be enabled. During the write (WT) operation, the first receiver 32 of the reception circuit 30 may receive a signal transferred through the through electrode TSV and transmit the received signal to the internal circuit through the first global line GIO_S. The internal circuit 40 may write the transmitted signal to the bank. During the read (RD) operation, when data/signals read from the internal circuit 40 are transferred to the first buffer 22A of the transmission circuit 20 through the first global line GIO_S, the first buffer 22A may invert and buffer the first transmission signal S1 and output the resultant signal as the driving control signal DRV_C. When the output control signal TX_EN is enabled at a logic high level, the driving circuit 24 may transfer the signal to the through electrode TSV by driving the through line GIO_TSV according to the driving control signal DRV_C. The signal transferred through the through electrode TSV may be transferred to the master chip and be output to an external device such as a controller (not shown) or a tester device (not shown).

Figure 2B:
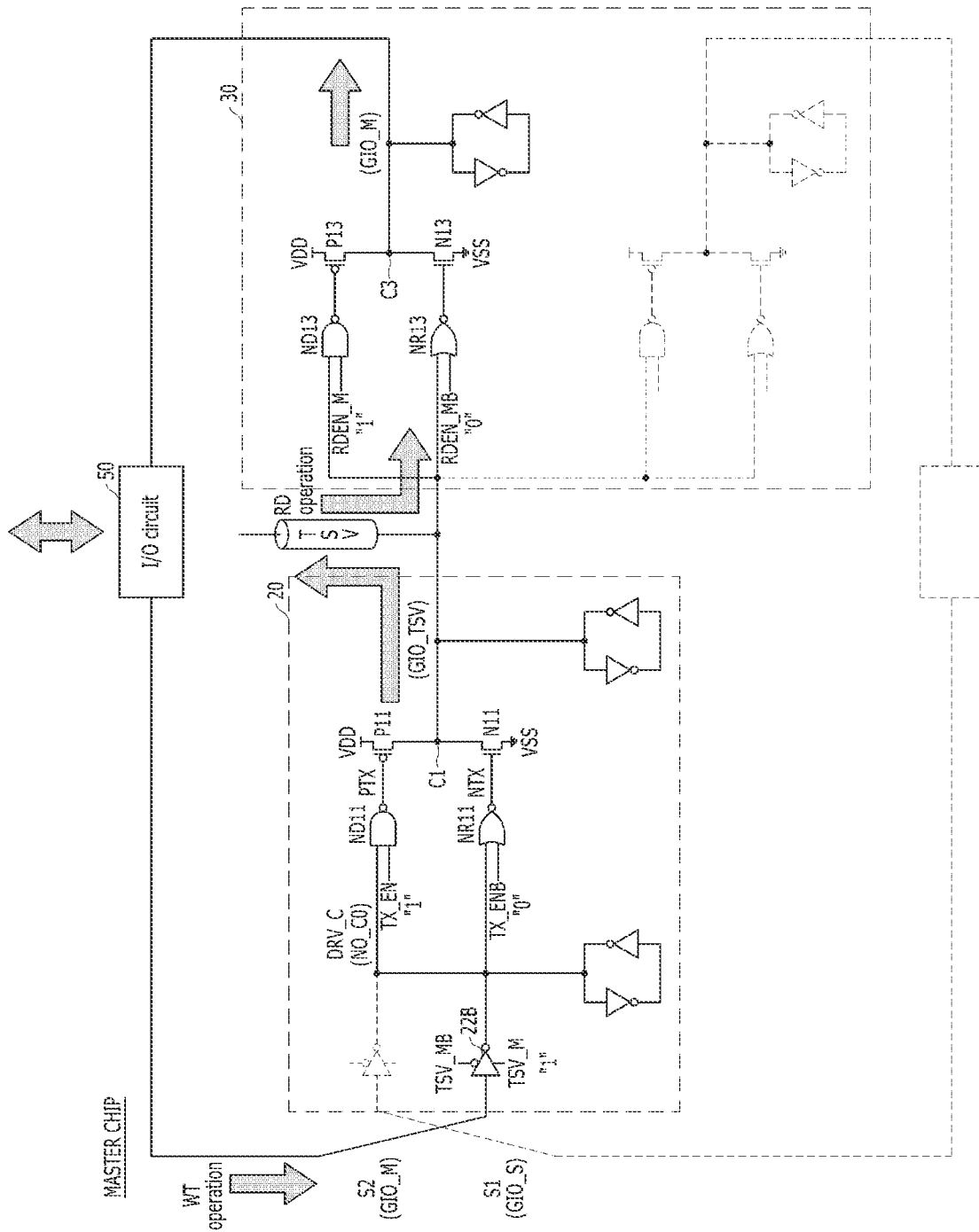

The second receiver 34 of the reception circuit 30 and the second buffer 22B of the transmission circuit 20 may be connected to the input/output (I/O) circuit 50 through the second global line GIO_M. As illustrated in FIG. 2B, when the semiconductor device 10 is a master chip, the second input control signal RDEN_M and the master selection signal TSV_M may be enabled. During the write (WT) operation, signals/data are input from the external device to the I/O circuit 50. When the second transmission signal S2 is transmitted from the I/O circuit 50 to the second buffer 22B of the transmission circuit 20, the second buffer 22B may invert and buffer the second transmission signal S2 and output the resultant signal as the driving control signal DRV_C. When the output control signal TX_EN is enabled at a logic high level, the driving circuit 24 may transfer the signal to the through electrode TSV by driving the through line GIO_TSV according to the driving control signal DRV_C. The signal transmitted through the through electrode TSV may be transmitted to the slave chip, allowing the write (WT) operation to be carried out. On the other hand, during the read operation, the second receiver 34 of the reception circuit 30 may receive the signal transmitted through the through electrode TSV and transmit the received signal to the I/O circuit 50 through the second global line GIO_M. The I/O circuit 50 may output the received signal/data to an external device.

As described above, when the semiconductor device serves as the slave chip and the master chip, the transmission circuit and the reception circuit may operate in opposite ways during the read operation and the write operation.

When the semiconductor device 10 is implemented as an SDP and DDP-type chip, no through electrode TSV is actually formed, but the transmission circuit 20 and the reception circuit 30 for through electrodes are formed. In this case, the transmission circuit 20 and the reception circuit 30, which are not to be used, may be controlled to remain in the idle state.

Figure 3:
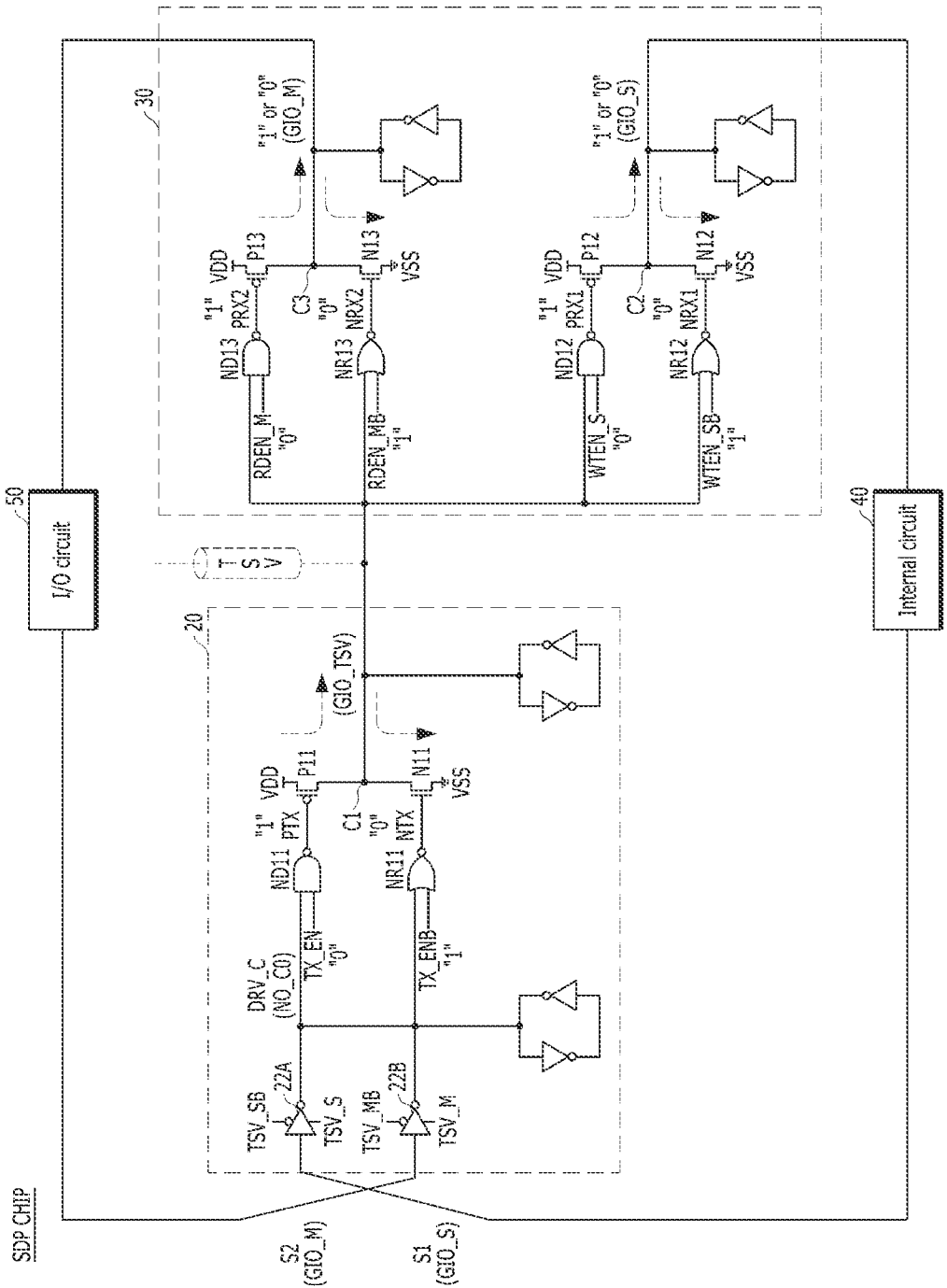
FIG. 3 is a diagram illustrating an operation when the semiconductor device of FIG. 1 is implemented as an SDP-type chip.

FIG. 3 is a diagram illustrating an operation when the semiconductor device 10 of FIG. 1 is implemented as an SDP-type chip, although the operation is the same or substantially the same even when the semiconductor device 10 is implemented as a DDP-type chip. According to an embodiment, even where the semiconductor device 10 is implemented as a QDP-type chip and the through electrode TSV is formed, the semiconductor device 10 may operate as described below when the through electrode TSV is packaged together although not used.

Referring to FIG. 3, when the semiconductor device 10 is implemented as an SDP-type chip, no through electrode TSV is formed. The output control signal TX_EN, the second input control signal RDEN_M, and the first input control signal WTEN_S are disabled at a logic low level.

In response to the output control signal TX_EN of the logic low level, the pull-up driving signal PTX is fixed to the logic high level, and the pull-down driving signal NTX is fixed to the logic low level. Accordingly, both the pull-up transistor P11 and the pull-down transistor N11 of the driving circuit 24 are turned off, so that the transmission circuit 20 maintains the idle state.

In response to the first input control signal WTEN_S of the logic low level, the pull-up driving signal PRX1 is fixed to the logic high level, and the pull-down driving signal NRX1 is fixed to the logic low level. Similarly, in response to the second input control signal RDEN_M of the logic low level, the pull-up driving signal PRX2 is fixed to the logic high level and the pull-down driving signal NRX2 is fixed to the logic low level. Likewise, both the pull-up transistor and the pull-down transistor of the first receiver 32 and the second receiver 34 are thus turned off, so that the reception circuit 30 maintains the idle state.

In FIG. 3, all of the first global line (GIO_S), the second global line (GIO_M), and the through line (GIO_TSV) may latch and maintain one of the logic high and logic low level, arbitrarily determined according to the process-voltage-temperature (PVT) conditions, rather than being set to a specific value. As a result, in the idle state, a leakage path of the pull-up transistors or pull-down transistors of the circuits 24, 32, and 34 is formed by the values latched on the first global line GIO_S, the second global line GIO_M, and the through line GIO_TSV. For example, when the through line GIO_TSV maintains the logic low level, a leakage path may be formed between the pull-up transistor P11 and the through line GIO_TSV and, when the through line GIO_TSV maintains the logic high level, a leakage path may be formed between the pull-down transistor N11 and the through line GIO_TSV. As described above, the off-current (i.e., the leakage current of the transistor) increases in the SDP-type or DDP-type semiconductor chip due to the idle transmission/reception circuit.

Described below is a method for reducing an off-current caused by unused circuit(s) or circuit(s) present only for testing when various configurations are implemented in one semiconductor chip.

Prior to describing embodiments of the disclosure, bias temperature instability (BTI) is described.

Figure 4:
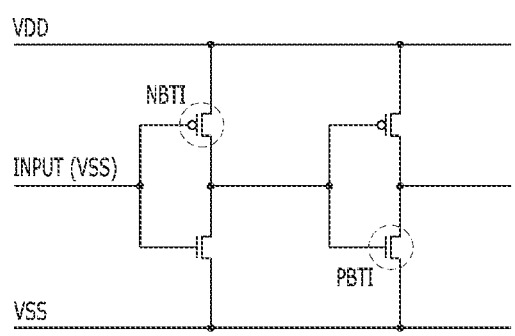
FIG. 4 is a circuit diagram illustrating a BTI phenomenon in an inverter chain.

FIG. 4 is a diagram illustrating a BTI phenomenon in an inverter chain.

Referring to FIG. 4, PMOS transistors and NMOS transistors may be deteriorated mainly due to stress in an idle or standby state. In the idle state, since the input signal (INPUT) of the inverter chain reaches the ground voltage (VSS) level, a logic low level signal is applied to the gates of the PMOS transistor and NMOS transistor arranged in the first stage of the inverter chain, and a logic high level signal is applied to the gates of the PMOS transistor and NMOS transistor in the second stage of the inverter chain.

When a high electric field is applied to the gate of the PMOS transistor for a long time, the negative bias used in the semiconductor device becomes unstable according to a change in temperature. This is called negative bias temperature instability (NBTI). When NBTI occurs, the threshold voltage Vth of the PMOS transistor increases, and performance of the semiconductor memory device may deteriorate. Conversely, an increase in the threshold voltage Vth of the NMOS transistors is referred to as positive bias temperature instability (PBTI) and, when PBTI occurs, the threshold voltage Vth of the NMOS transistor increases.

That is, in the idle state, the PMOS transistor disposed in the first stage remains on, causing NBTI. The NMOS transistor in the second stage also remains on, causing PBTI. In a normal operation, assuming that the pulses of 'L'->'H'->'L' are sequentially applied as the input signal (INPUT) of the inverter chain, the NMOS transistor in the first stage is turned on at the rising edge of the input signal (INPUT), and the PMOS transistor in the second stage is turned on, so that BTI does not occur. However, at the failing edge of the returning-back input signal (INPUT) of 'H'->'L', the transistors, which have been deteriorated due to NBTI and PBTI, operate, so that the reaction slows down. Accordingly, although the rising edge timing is constant, the failing edge timing is gradually prolonged, rendering it difficult to perform a desired operation.

Described below is a method for accelerating the deterioration of one type of transistors among PMOS transistors and NMOS transistors arranged in test circuit(s) or unused circuit(s) using such BTI to thereby reduce the off-current generated due to such circuits.

Figure 5:
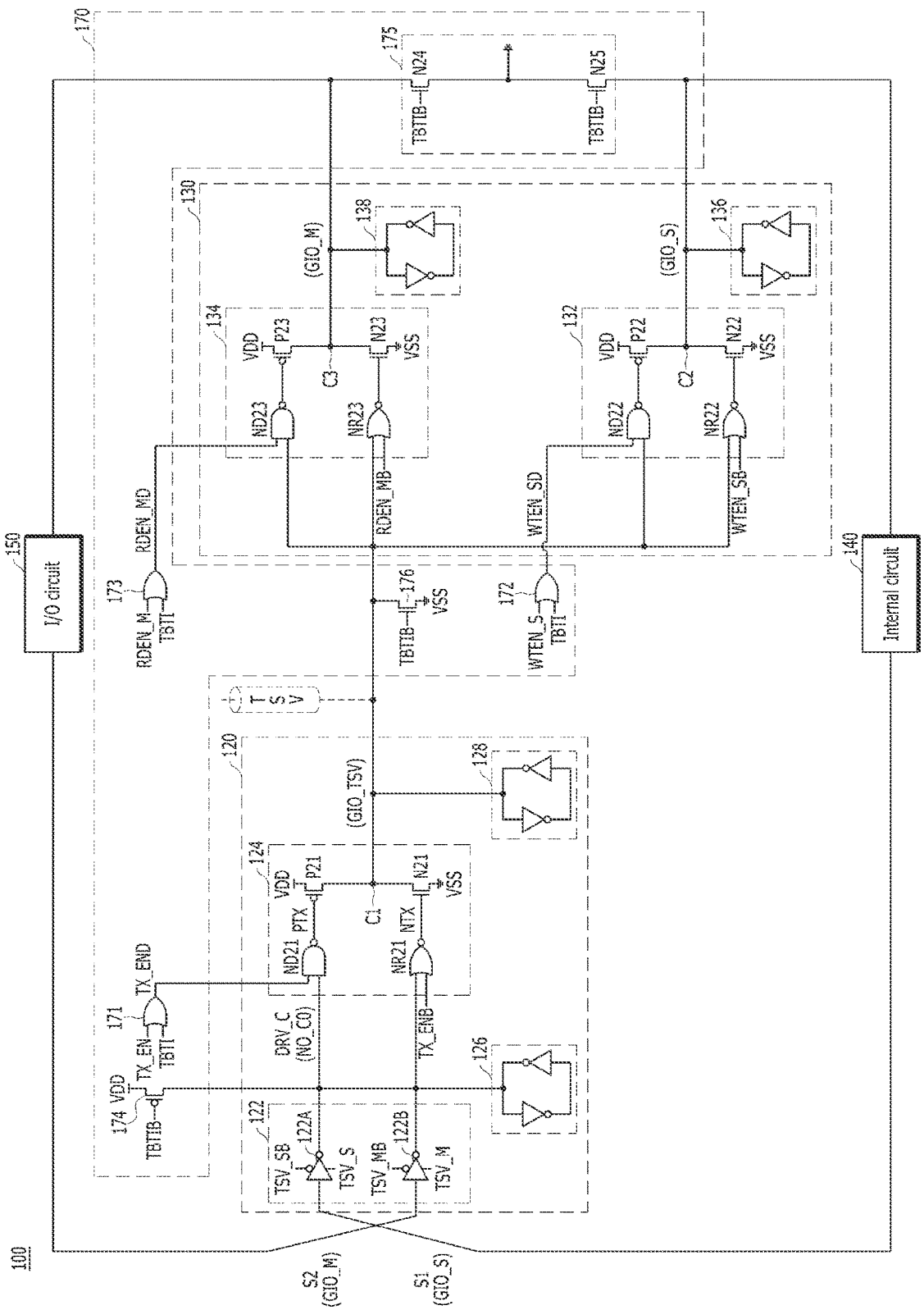
FIG. 5 is a diagram illustrating a configuration of a semiconductor device according to an embodiment.

FIG. 5 is a diagram illustrating a configuration of a semiconductor device 100 according to an embodiment.

Referring to FIG. 5, the semiconductor device 100 may include a transmission circuit 120 and reception circuit 130 corresponding to a through electrode TSV, and a deterioration acceleration circuit 170. By way of example, although FIG. 5 illustrates an example in which the semiconductor device 100 includes the transmission circuit 120 and the reception circuit 130 corresponding to one through electrode, the semiconductor device 100 may in practice include transmission circuits and reception circuits corresponding to a plurality of through electrodes. In some embodiments, the semiconductor device 100 may be an SDP-type or DDP-type chip. That is, the semiconductor device 100 may be an SDP-type or DDP-type chip including the transmission circuit 120 and the reception circuit 130 for the through electrode which are to be unused.

The transmission circuit 120 may include a first transistor P21 and a second transistor N21 connected in series between the power supply voltage VDD terminal and the ground voltage VSS terminal and including a first common node C1 connected to the through line GIO_TSV. The transmission circuit 120 may output a signal transmitted from the internal circuit 140 to the first common node C1 according to the output control signal TX_END. When the semiconductor device 100 is an SDP-type or DDP-type chip, since the through electrode TSV is not formed, the through line GIO_TSV may be an unused line.

The reception circuit 130 may include a third transistor P22 and a fourth transistor N22 connected in series between the power supply voltage VDD terminal and the ground voltage VSS terminal and including a second common node C2 connected to the internal circuit 140. The reception circuit 130 may receive a signal transmitted through the through line GIO_TSV according to the first input control signal WTEN_SD and transmit the received signal to the internal circuit 140 through the second common node C2. The reception circuit 130 may include a fifth transistor P23 and a sixth transistor N23 connected in series between the power supply voltage VDD terminal and the ground voltage VSS terminal and including a third common node C3 connected to the input/output (I/O) circuit 150. The reception circuit 130 may receive a signal transmitted through the through line GIO_TSV according to the second input control signal RDEN_MD and transmit the received signal to the I/O circuit 150 through the third common node C3.

In some embodiments, the first transistor P21, the third transistor P22, and the fifth transistor P23 may be pull-up transistors, and may be implemented as PMOS transistors. The second transistor N21, the fourth transistor N22, and the sixth transistor N23 may be pull-down transistors, and may be implemented as NMOS transistors. Hereinafter, the first transistor P21 and the second transistor N21 may be referred to as a first pull-up transistor and a first pull-down transistor, respectively, the third transistor P22 and the fourth transistor N22 as a second pull-up transistor and a second pull-down transistor, respectively, and the fifth transistor P23 and the sixth transistor N23 as a third pull-up transistor and a third pull-down transistor, respectively.

The deterioration acceleration circuit 170 may apply stress to the first to third pull-up transistors P21 to P23 according to a test signal TBTI. The test signal TBTI may be enabled for a deterioration acceleration operation during a test operation. That is, the deterioration acceleration circuit 170 may apply stress to the PMOS transistors during the deterioration acceleration operation. According to an embodiment, the deterioration acceleration circuit 170 may apply stress to the first to third pull-down transistors N21 to N23 according to the test signal TBTI. That is, the deterioration acceleration circuit 170 may apply stress to the NMOS transistors during the deterioration acceleration operation.

Specifically, the transmission circuit 120 may include a driving control circuit 122 and a driving circuit 124. The driving control circuit 122 may include a first buffer 122A and a second buffer 122B. The driving circuit 124 may include a first NAND gate ND21, a first NOR gate NR21, a first pull-up transistor P21, and a first pull-down transistor N21. The transmission circuit 120 may further include a first latch circuit 126 and a second latch circuit 128. The driving control circuit 122 and the driving circuit 124 of FIG. 5 are substantially the same in configuration as the driving control circuit 22 and the driving circuit 24 of FIG. 1.

The reception circuit 130 may include a first receiver 132 and a second receiver 134. The first receiver 132 may include a second pull-up transistor P22 and a second pull-down transistor N22 having a second common node C2 connected to the internal circuit 140 through a first global line GIO_S and transmit a signal transmitted through the through line GIO_TSV to the first global line GIO_S according to the first input control signal WTEN_SD. The second receiver 134 may include a third pull-up transistor P23 and a third pull-down transistor N23 having a third common node C3 connected to the internal circuit 140 through a second global line GIO_M and transmit a signal transmitted through the through line GIO_TSV to the second global line GIO_M according to the second input control signal RDEN_MD. The first receiver 132 may include a second NAND gate ND22, a second NOR gate NR22, a second pull-up transistor P22, and a second pull-down transistor N22. The second receiver 134 may include a third NAND gate ND23, a third NOR gate NR23, a third pull-up transistor P23, and a third pull-down transistor N23. The reception circuit 130 may further include a third latch circuit 136 and a fourth latch circuit 138. The first receiver 132, the second receiver 134, the third latch circuit 136, and the fourth latch circuit 138 of FIG. 5 are substantially the same in configuration as those of FIG. 1.

The deterioration acceleration circuit 170 may include first to third turn-on control circuits 171 to 173 and first to third bias application circuits 174 to 176.

The first turn-on control circuit 171 may control the first pull-up transistor P21 to be turned on according to the test signal TBTI. The first turn-on control circuit 171 may perform a logic OR operation on the test signal TBTI and a preliminary output control signal TX_EN and output the resultant signal as an output control signal TX_END. The first turn-on control circuit 171 may output the output control signal TX_END at the logic high level when the test signal TBTI is enabled at the logic high level. When the output control signal TX_EN is enabled at the logic high level, the driving circuit 124 may drive the through line GIO_TSV according to the driving control signal DRV_C. In particular, when the output control signal TX_END is enabled at a logic high level and the driving control signal DRV_C is at a logic high level, the driving circuit 124 may drive the through line GIO_TSV at a power supply voltage VDD.

The second turn-on control circuit 172 may control the second pull-up transistor P22 to be turned on according to the test signal TBTI. The second turn-on control circuit 172 may perform a logic OR operation on the test signal TBTI and the first preliminary input control signal WTEN_S and output the resultant signal as the first input control signal WTEN_SD. The second turn-on control circuit 172 may output the first input control signal WTEN_SD at the logic high level when the test signal TBTI is enabled at the logic high level. When the first input control signal WTEN_SD is enabled at the logic high level, the first receiver 132 may transmit the signal transferred to the through line GIO_TSV to the first global line GIO_S. In particular, when the first input control signal WTEN_SD is enabled at the logic high level, and the signal transferred to the through line GIO_TSV is at the logic high level, the first receiver 132 may drive the first global line GIO_S at the power supply voltage (VDD) level.

The third turn-on control circuit 173 may control the third pull-up transistor P23 to be turned on according to the test signal TBTI. The third turn-on control circuit 173 may perform a logic OR operation on the test signal TBTI and the second preliminary input control signal RDEN_M and output the resultant signal as the second input control signal RDEN_MD. The third turn-on control circuit 173 may output the second input control signal RDEN_MD at the logic high level when the test signal TBTI is enabled at the logic high level. When the second input control signal RDEN_MD is enabled at the logic high level, the second receiver 134 may transmit the signal transferred to the through line GIO_TSV to the second global line GIO_M. In particular, when the second input control signal RDEN_MD is enabled at the logic high level, and the signal transferred to the through line GIO_TSV is at the logic high level, the second receiver 134 may drive the second global line GIO_M at the power supply voltage (VDD) level.

The first bias application circuit 174 may fix the driving control signal DRV_C to the power supply voltage (VDD) level according to the test signal TBTI. The first bias application circuit 174 may apply the power supply voltage (VDD) level to the control node NO_C0 when the test signal TBTI is enabled to the logic high level, i.e., when the inverted signal TBTIB of the test signal TBTI is at the logic low level and thus enabled. The first bias application circuit 174 may be implemented as a PMOS transistor that is connected between the power supply voltage VDD terminal and the control node NO_C0 and receives the inverted signal TBTIB of the test signal TBTI through the gate.

The second bias application circuit 175 may fix the second common node C2 and the third common node C3 to the ground voltage (VSS) level according to the test signal TBTI. The second bias application circuit 175 may ground the second common node C2 and the third common node C3 to the ground voltage (VSS) level when the inverted signal TBTIB is enabled to the logic high level. The second bias application circuit 175 may be implemented as an NMOS transistor N24 connected between the ground voltage VSS terminal and the second common node C2 and receiving the inverted signal TBTIB through the gate and an NMOS transistor N25 connected between the ground voltage VSS terminal and the third common nodes C3 and receiving the inverted signal TBTIB through the gate.

The third bias application circuit 176 may fix the through line GIO_TSV to the ground voltage (VSS) level according to the test signal TBTI. When the inverted signal TBTIB is enabled at the logic high level, the third bias application circuit 176 may ground the through line GIO_TSV to the ground voltage (VSS) level. The third bias application circuit 176 may be implemented as an NMOS transistor that is connected between the ground voltage VSS terminal and the through line GIO_TSV and receives the inverted signal TBTIB through the gate.

A method of operating the memory device 100 is described below with reference to FIGS. 5 to 7.

Figure 6:
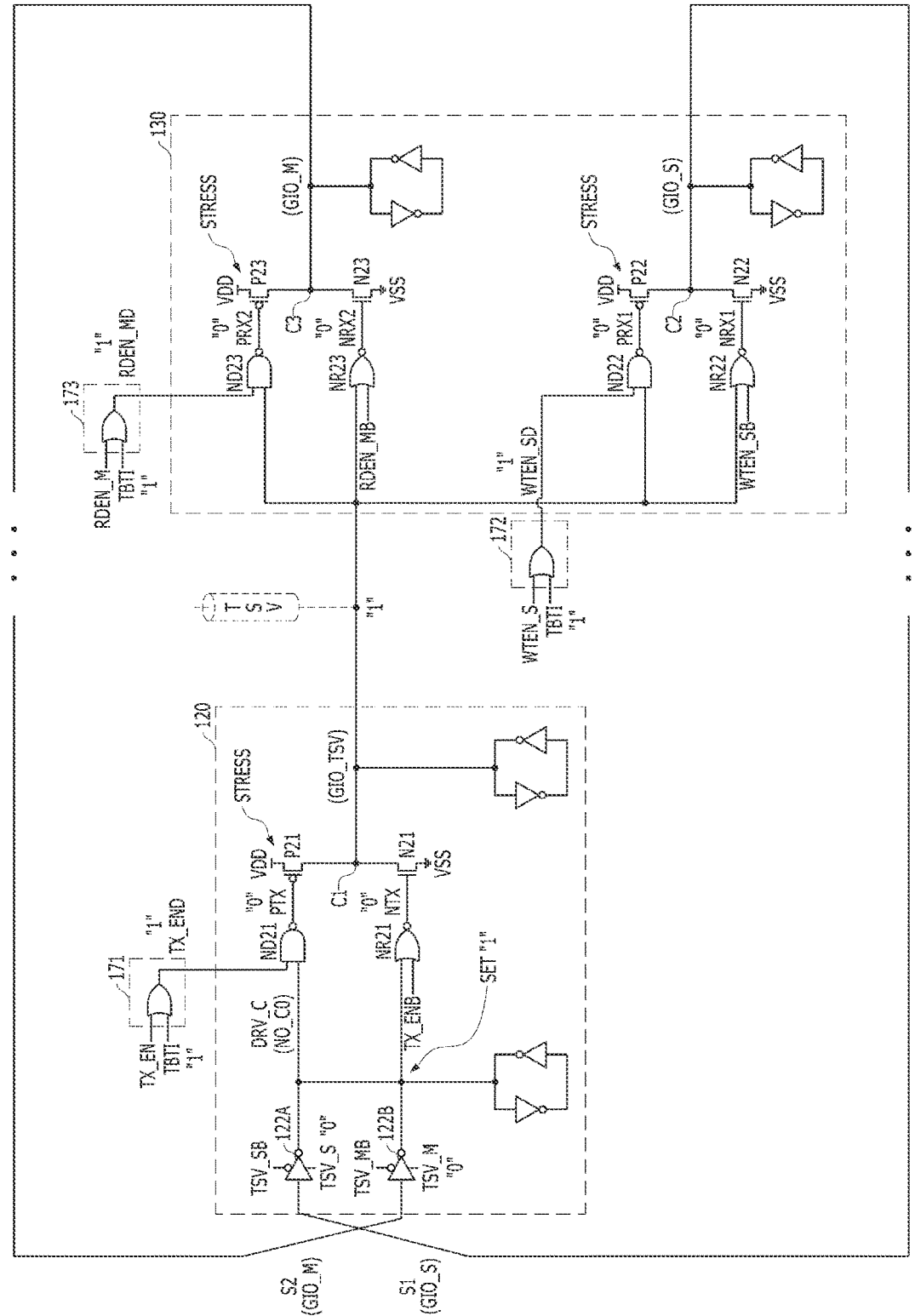
FIG. 6 is a diagram illustrating a deterioration acceleration operation of the semiconductor device of FIG. 5.

FIG. 6 is a diagram illustrating a deterioration acceleration operation of the memory device 100 of FIG. 5.

Referring to FIG. 6, during the deterioration acceleration operation, the test signal TBTI becomes a logic high level, and the inverted signal TBTIB becomes a logic low level. In this case, the first bias application circuit 174 may apply the power supply voltage (VDD) level to the control node NO_C0 according to the test signal TBTI.

The first turn-on control circuit 171 performs a logic OR operation on the test signal TBTI and the preliminary output control signal TX_EN and outputs the output control signal TX_END of a logic high level. The second turn-on control circuit 172 performs a logic OR operation on the test signal TBTI and the first preliminary input control signal WTEN_S and outputs the first input control signal WTEN_SD of a logic high level. The third turn-on control circuit 173 performs a logic OR operation on the test signal TBTI and the second preliminary input control signal RDEN_M and outputs the second input control signal RDEN_MD of a logic high level. Accordingly, all of the pull-up driving signals PTX, PRX1, and PRX2 become the logic low level, so that all of the first to third pull-up transistors P21 to P23 are controlled to turned on. To prevent signal collision, both the master/slave selection signals TSV_S and TSV_M may be disabled at a logic low level.

That is, during the deterioration acceleration operation, stress is applied to the PMOS transistors, causing an NBTI phenomenon and hence an increase in the threshold voltage Vth of the PMOS transistors. Accordingly, deterioration of the PMOS transistors is accelerated.

Figure 7:
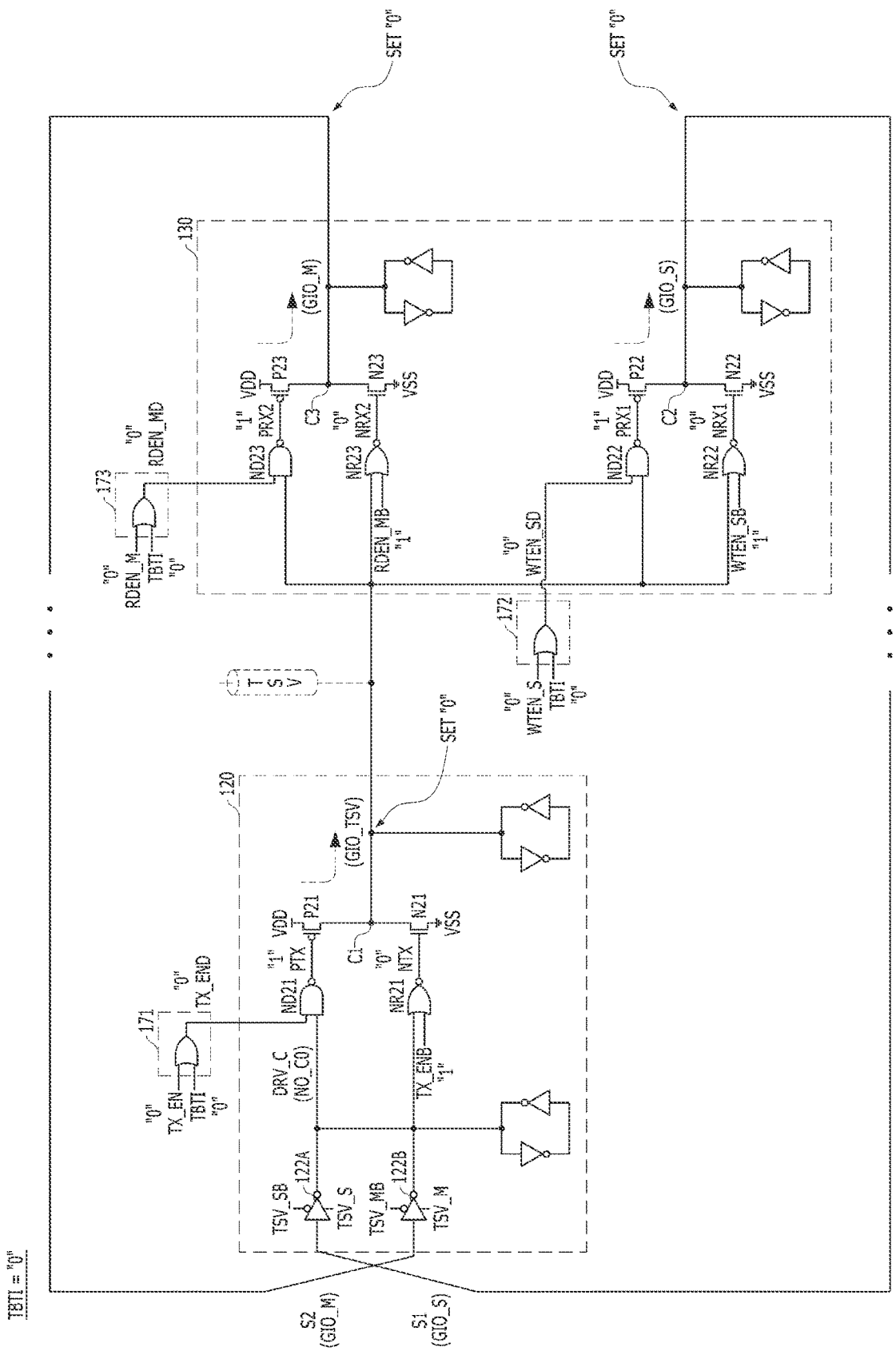
FIG. 7 is a diagram illustrating a normal operation of the semiconductor device of FIG. 5.

FIG. 7 is a diagram illustrating a normal operation of the memory device 100 of FIG. 5.

Referring to FIG. 7, during the normal operation, the test signal TBTI becomes a logic low level, and the inverted signal TBTIB becomes a logic high level. The preliminary output control signal TX_EN, the first preliminary input control signal WTEN_S, and the second preliminary input control signal RDEN_M are disabled at a logic low level.

The second bias application circuit 175 may be enabled according to the inverted signal TBTIB, fixing the second common node C2 and the third common node C3 to the ground voltage (VSS) level. The third bias application circuit 176 may be enabled according to the inverted signal TBTIB, fixing the through line GIO_TSV to the ground voltage (VSS) level. The first turn-on control circuit 171 performs a logic OR operation on the test signal TBTI and the preliminary output control signal TX_EN and outputs the output control signal TX_END of a logic low level. The second turn-on control circuit 172 performs a logic OR operation on the test signal TBTI and the first preliminary input control signal WTEN_S and outputs the first input control signal WTEN_SD of a logic low level. The third turn-on control circuit 173 performs a logic OR operation on the test signal TBTI and the second preliminary input control signal RDEN_M and outputs the second input control signal RDEN_MD of a logic low level.

Accordingly, all of the pull-up driving signals PTX, PRX1, and PRX2 become a logic high level, and all of the pull-down driving signals NTX, NRX1 and NRX2 become a logic low level. Accordingly, both the first pull-up transistor P21 and the first pull-down transistor N21 of the driving circuit 124 are turned off, so that the transmission circuit 120 maintains the idle state. Similarly, the second and third pull-up transistors P22 and P23 and the second and third pull-down transistors N22 and N23 of the first receiver 132 and the second receiver 34 are all turned off, so that the reception circuit 130 maintains the idle state.

In this case, the through line GIO_TSV, the second common node C2, and the third common node C3 are all grounded, so that a leakage path occurs only in the first to third pull-up transistors P21 to P23 which have been deteriorated by the application of stress. In other words, while a leakage current is generated in all of the PMOS and NMOS transistors in the normal operation of the SDP-type or DDP-type chip described above in connection with FIG. 3, a leakage current occurs only in the PMOS transistors in the normal operation of the SDP-type or DDP-type chip according to an embodiment. Thus, the total off-current may be reduced.

Figure 8:
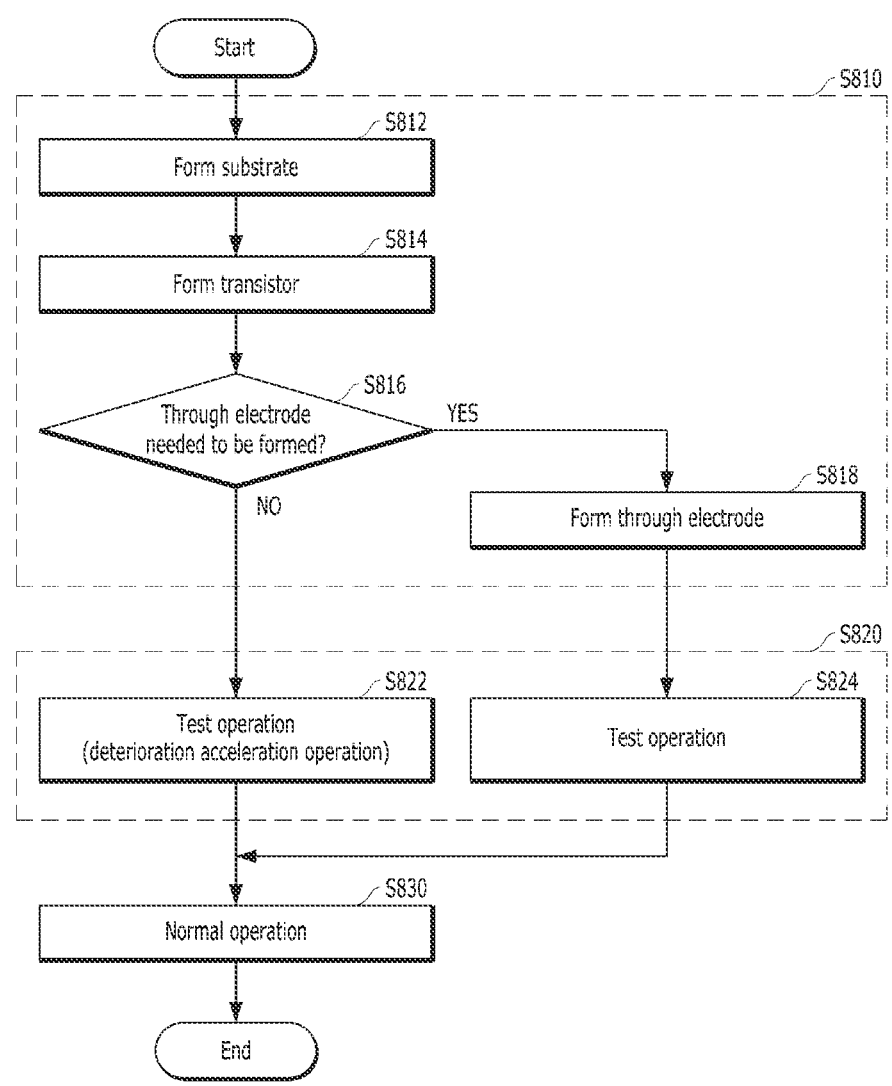
FIG. 8 is a diagram illustrating a method for operating a semiconductor device according to an embodiment.

FIG. 8 is a diagram illustrating a method for operating a semiconductor device according to an embodiment.

Referring to FIG. 8, a method of operating a semiconductor device may include providing a semiconductor device (at operation S810), performing a test operation (at operation S820), and performing a normal operation (at operation S830).

In the providing a semiconductor device (at operation S810), a semiconductor device is manufactured. The operation S810 may include the operation S812 of forming a semiconductor substrate, the operation S814 of forming circuit elements, such as transistors, on the semiconductor substrate, and the operation S816 of forming a through electrode.

Specifically, the semiconductor substrate is formed of silicon in the form of a wafer or divided into chip units (at operation S812). The semiconductor substrate may include a first surface and a second surface. The first surface of the semiconductor substrate may be a surface on which an active region, where circuit elements are formed, is present, and may mean a front side. The second surface of the semiconductor substrate may be a surface opposite to the first surface and may mean a back side.

Next, transistors may be formed with gates and sources/drains on both sides of each gate on the first surface of the semiconductor substrate and in the semiconductor substrate (at operation S814). In this case, the transistors may include the first pull-up transistor P21 and first pull-down transistor N21 driving the first common node C1 connected with the through line GIO_TSV, the second pull-up transistor P22 and the second pull-down transistor N22 receiving the signal transferred through the through line GIO_TSV and driving the second common node C2 connected with the first global line GIO_S, and the third pull-up transistor P23 and third pull-down transistor N23 receiving the signal transferred through the through line GIO_TSV and driving the third common node C3 connected with the second global line GIO_M. In the case of a DRAM device, in addition to the above-described transistors, bit lines and capacitors may be further formed on the first surface of the semiconductor substrate.

Then, it may be determined whether to form a through electrode connected to the through line GIO_TSV (at operation S816). For example, when the semiconductor device is a QDP-type chip or a 3-Dimensional Stacked (3DS) semiconductor chip, a through electrode needs to be formed but, when the semiconductor device is an SDP-type or DDP-type chip, a through electrode need not be formed. When the semiconductor device is a 3DS-type chip, a through electrode is formed (at operation S818). The through electrode may include a through hole vertically penetrating the semiconductor substrate, a barrier layer formed on an inner sidewall of the through hole, and a metal layer formed on the barrier layer and filling the through hole. The through hole may extend from the first surface to the second surface of the semiconductor substrate. The barrier layer may suppress diffusion of a metal material included in the metal layer into the semiconductor substrate. The metal layer may include copper (Cu), but is not particularly limited thereto.

When the process of the semiconductor device is completed, a test operation may be performed (at operation S820). The test operation may include a burn-in test in which a product is tested in an environment worse than an actual environment by applying excessive stress to the semiconductor device for a short time. In the burn-in test, it is possible to test not only direct current (DC) but also read and write operations. In the case of a 3DS-type semiconductor device, a general burn-in test may be performed (at operation S824). In the case of an SDP-type or DDP-type semiconductor device, the deterioration acceleration operation may be additionally performed during the test operation according to an embodiment (at operation S822). That is, as described above in connection with FIG. 6, during the deterioration acceleration operation, stress is applied only to PMOS transistors, causing an NBTI phenomenon and hence an increase in the threshold voltage Vth of the first to third pull-up transistors P21 to P23 which are PMOS transistors. Accordingly, deterioration of the PMOS transistors is accelerated.

Thereafter, a normal operation of the semiconductor device, e.g., of an SDP-type or DDP-type, may be performed (at operation S830). The normal operation may include a read operation and/or a write operation. For example, as illustrated in FIG. 7, in the normal operation, while the transmission circuit 120 and the reception circuit 130 maintain the idle state, the through line GIO_TSV, the second common node C2, and the three common nodes C3 are all grounded, leakage paths are generated from the deteriorated first to third pull-up transistors P21 to P23 to the first to third common nodes C1 to C3, respectively. In other words, when the SDP-type or DDP-type chip performs a normal operation, leakage current is generated only by the PMOS transistors, so that the total off-current may be reduced.

In the above-described embodiments, the transmission/reception circuits for a through electrode have been described as an example, but embodiments of the disclosure are not limited thereto. For example, embodiments of the disclosure may be widely applicable to any circuit that exists only for test operation(s), any input/output (I/O) circuit not supposed to be used, and/or clock tree repeaters.

Figure 9:
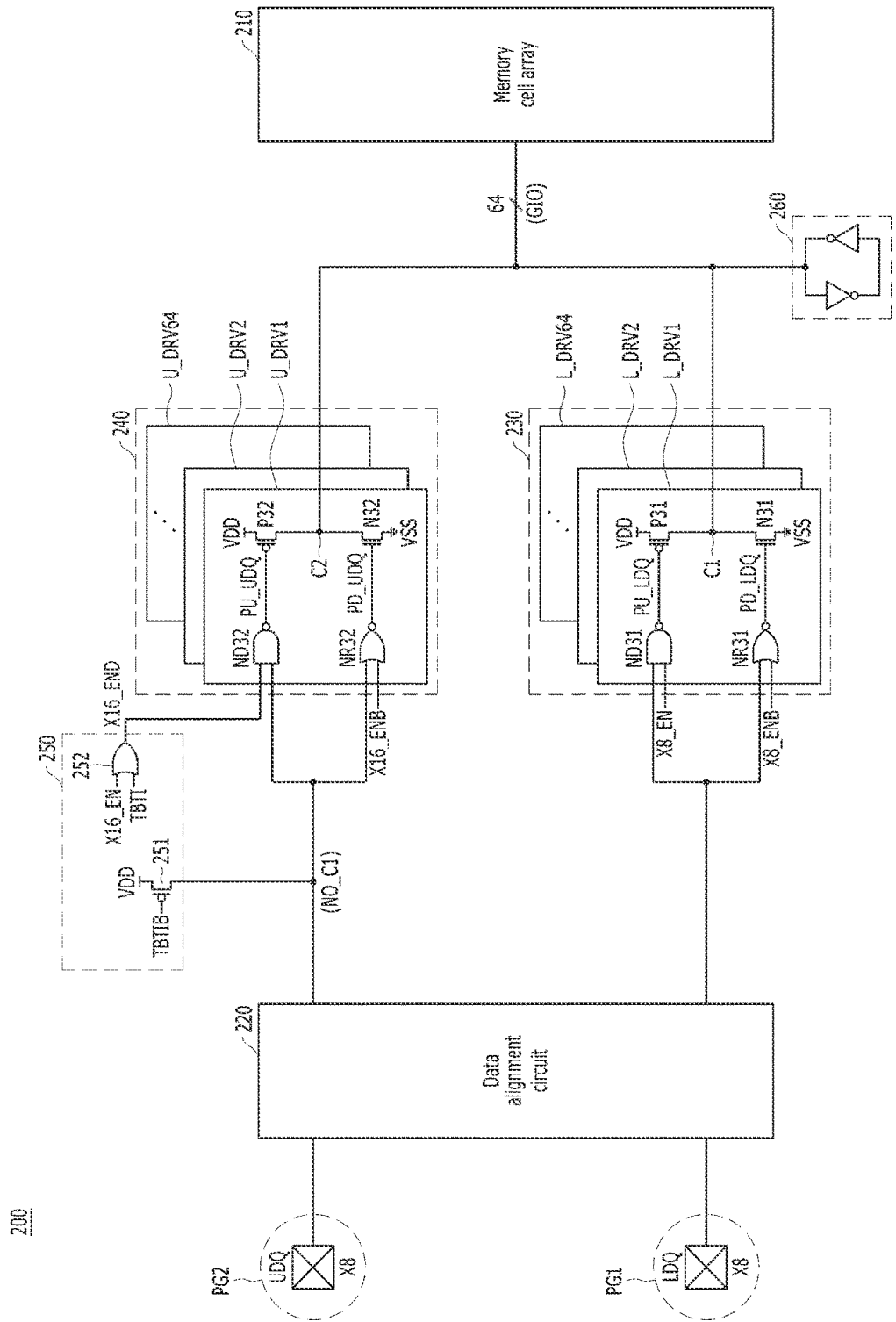
FIG. 9 is a diagram illustrating a configuration of a semiconductor device according to an embodiment.

FIG. 9 is a diagram illustrating a configuration of a semiconductor device 200 according to an embodiment. The semiconductor device 200 of FIG. 9 may be a memory device.

Referring to FIG. 9, the semiconductor device 200 may include a memory cell array 210, a first pad group PG1, a second pad group PG2, a data alignment circuit 220, a first driving circuit 230, a second driving circuit 240, and a deterioration acceleration circuit 250.

The first pad group PG1 may include a plurality of first input/output pads LDQ. The second pad group PG2 may include a plurality of second input/output pads UDQ. The first input/output pads LDQ may input/output data when the data width option is set to the X8 or X16 mode. The second input/output pads UDQ may input/output data only when the data width option is set to the X16 mode, and may be disabled, i.e., not to be unused, when the data width option is set to the X8 mode. For example, when the data width option is set to the X8 mode, data may be input/output through the first input/output pads LDQ of the first pad group PG1 and, when the data width option is set to the X16 mode, data may be input/output through the first input/output pads LDQ of the first pad group PG1 and the second input/output pads UDQ of the second pad group PG2. FIG. 9 illustrates an example where each of the first and second pad groups PG1 and PG2 includes eight input/output pads.

The data alignment circuit 220 may align a set burst length (BL, e.g., BL=8) of serial data, which is input through the first pad group PG1 and/or the second pad group PG2. For example, the data alignment circuit 220 may include an input buffer (not shown) for receiving the data input through the first pad group PG1 and/or the second pad group PG2 during a write operation, a parallelizer (not shown) for parallelizing the received data, and a write pipe latch (not shown) for latching the parallelized data and may parallelize and latch serial data to thereby output parallel data. In the X8 mode, the data alignment circuit 220 may provide 64 pieces of parallel data by aligning 8-bit serial data input through the eight first input/output pads LDQ. In the X16 mode, the data alignment circuit 220 may align the 8-bit serial data input through the 8 first input/output pads LDQ and provide 64 pieces of parallel data, and the data alignment circuit 220 may then align the 8-bit serial data input through the eight second input/output pads UDQ and provide 64 pieces of parallel data.

The first driving circuit 230 may include the first pull-up transistor P31 and the first pull-down transistor N31 connected in series between the power supply voltage VDD terminal and the ground voltage VSS terminal and including the common node C1 connected to the global data line GIO. The first driving circuit 230 may transmit the data, transmitted from the first pad group PG1 through the data alignment circuit 220, to the global data line GIO according to the first driving control signal X8_EN. In some embodiments, the first driving control signal X8_EN may be enabled in both the X8 mode and the X16 mode. The first driving circuit 230 may include as many first drivers L_DRV1 to L_DRV64 as the number (e.g., 64) of the global data lines GIO. For example, the first drivers L_DRV1 to L_DRV64 may be arranged in an array form.

Specifically, each of the first drivers L_DRV1 to L_DRV64 may include a first NAND gate ND31, a first NOR gate NR31, a first pull-up transistor P31, and a first pull-down transistor N31. The first NAND gate ND31 may perform a logic NAND operation on data input from the first driving control signal X8_EN and one of the first input/output pads LDQ and output the resultant signal as a pull-up driving signal PULDQ. The first NOR gate NR31 may perform a logic NOR operation on the data and the inverted signal X8_ENB of the first driving control signal X8_EN and output the resultant signal as a pull-down driving signal PD_LDQ. The first pull-up transistor P31 may drive the corresponding global data line GIO at the power supply voltage (VDD) level according to the pull-up driving signal PU_LDQ. The first pull-down transistor N31 may drive the corresponding global data line GIO at the ground voltage (VSS) level according to the pull-down driving signal PD_LDQ. In some embodiments, the first pull-up transistor P31 may be configured as a PMOS transistor, and the first pull-down transistor N31 may be configured as an NMOS transistor. With the above configuration, the first driving circuit 230 may drive the global data line GIO according to data input from the first input/output pads LDQ when the first driving control signal X8_EN is enabled at the logic high level.

The second driving circuit 240 may include the second pull-up transistor P32 and the second pull-down transistor N32 connected in series between the power supply voltage VDD terminal and the ground voltage VSS terminal and including the common node C2 connected to the global data line GIO. The second driving circuit 240 may transmit the data, transmitted from the second pad group PG2 through the data alignment circuit 220, to the global data line GIO according to the second driving control signal X16_END. In some embodiments, the second driving control signal X16_END may be enabled when the second preliminary driving control signal X16_EN or the test signal TBTI is enabled. The second preliminary driving control signal X16_EN may be enabled in the X16 mode, and the test signal TBTI may be a signal enabled for a deterioration acceleration operation during a test operation. The second driving circuit 240 may include as many second drivers U_DRV1 to U_DRV64 as the number (e.g., 64) of the global data lines GIO. For example, the second drivers U_DRV1 to U_DRV64 may be arranged in an array form.

Specifically, each of the second drivers U_DRV1 to U_DRV64 may include a second NAND gate ND32, a second NOR gate NR32, a second pull-up transistor P32, and a second pull-down transistor N32. The second NAND gate ND32 may perform a logic NAND operation on data input from the second driving control signal X16_END and one of the second input/output pads UDQ and output the pull-up driving signal PU_UDQ. The second NOR gate NR32 may perform a logic NOR operation on the data and an inverted signal X16_ENB of the second preliminary driving control signal X16_EN to thereby output a pull-down driving signal PD_UDQ. The second pull-up transistor P32 may drive the corresponding global data line GIO at the power supply voltage (VDD) level according to the pull-up driving signal PU_UDQ. The second pull-down transistor N32 may drive the corresponding global data line GIO at the ground voltage (VSS) level according to the pull-down driving signal PD_UDQ. In some embodiments, the second pull-up transistor P32 may be configured as a PMOS transistor, and the second pull-down transistor N32 may be configured as an NMOS transistor.

The deterioration acceleration circuit 250 may apply stress to only the second pull-up transistor P32 according to the test signal TBTI. According to an embodiment, the deterioration acceleration circuit 250 may apply stress to only the second pull-down transistor N32 according to the test signal TBTI.

Specifically, the deterioration acceleration circuit 250 may include a bias application circuit 251 and a turn-on control circuit 252. The bias application circuit 251 may fix the data transmitted from the second pad group PG2 to the power supply voltage (VDD) level according to the test signal TBTI. When the test signal TBTI is enabled at the logic high level, i.e., when the inverted signal TBTIB of the test signal TBTI is at the logic low level, the bias application circuit 251 may apply the power supply voltage (VDD) level to the control node NO_C1 to which data is transferred. The bias application circuit 251 may be implemented as a PMOS transistor that is connected between the power supply voltage VDD terminal and the control node NO_C1 and receives the inverted signal TBTIB of the test signal TBTI through the gate of the PMOS transistor. The turn-on control circuit 252 may control the second pull-up transistor P32 to be turned on according to the test signal TBTI. The turn-on control circuit 252 may perform a logic OR operation on the test signal TBTI and the second preliminary driving control signal X16_EN and output the resultant signal as the second driving control signal X16_END. The turn-on control circuit 252 may output the second driving control signal X16_END at the logic high level when the test signal TBTI is enabled at the logic high level.

The memory cell array 210 may include a plurality of banks (not shown) including a plurality of memory cells connected between a plurality of word lines (not shown) and a plurality of bit lines (not shown). The memory cell array 210 may be connected to the first driving circuit 230 and the second driving circuit 240 through the global data line GIO, allowing each bank to receive the data input through the first pad group PG1 and the second pad group PG2, The semiconductor device 200 may further include a latch circuit 260 for latching the data transferred through the global data line GIO and maintaining the logic level. The latch circuit 260 may include two inverters connected in series.

Configurations supporting all data width options of X8 or X16 mode may be implemented in one semiconductor device for cost saving purposes. In this case, when the semiconductor device operates only in the X8 mode, circuit configurations related to the X16 mode are not used. According to an embodiment, the semiconductor device 200 may be a semiconductor device in which the data width option is set to the X8 mode. When the semiconductor device 200 operates only in the X8 mode, it is possible to reduce the off-current caused by the unused circuits by accelerating the deterioration of the PMOS transistors among the circuit configurations related to the unused X16 mode.

A method of operating the memory device 200 is described below.

During the deterioration acceleration operation, the test signal TBTI becomes a logic high level, and the inverted signal TBTIB becomes a logic low level. In this case, the bias application circuit 251 may apply the power supply voltage (VDD) level to the control node NO_C1 according to the test signal TBTI. The turn-on control circuit 252 performs a logic OR operation on the test signal TBTI and the second preliminary driving control signal X16_EN and outputs the second driving control signal X16_END of logic high level. Accordingly, the pull-up driving signal PU_UDQ becomes a logic low level, controlling the second pull-up transistor P32 to turn on. Accordingly, during the deterioration acceleration operation, stress is applied to the PMOS transistor of the second driving circuit 240, which is to be unused, causing an NBTI phenomenon and resultantly an increase in the threshold voltage Vth of the PMOS transistor. Accordingly, deterioration of the PMOS transistor is accelerated.

During the normal operation, the test signal TBTI becomes a logic low level, and the inverted signal TBTIB becomes a logic high level. When the semiconductor device 200 operates in the X8 mode, the first driving control signal X8_EN is enabled at the logic high level, and the second preliminary driving control signal X16_EN is disabled at the logic low level. The turn-on control circuit 252 performs a logic OR operation on the test signal TBTI and the second preliminary driving control signal X16_EN and outputs the second driving control signal X16_END of logic low level.

The first driving circuit 230 may drive the global data line GIO according to data input from the first input/output pads LDQ when the first driving control signal X8_EN is enabled at the logic high level. On the other hand, in the second driving circuit 240, when the second driving control signal X16_END is disabled to the logic low level and the inverted signal X16_ENB is disabled to the logic high level, the pull-up driving signal PU_UDQ becomes the logic high level, and the pull-down driving signal PD_UDQ becomes the logic low level. Accordingly, both the second pull-up transistor P32 and the second pull-down transistor N32 of the second driving circuit 240 are turned off, so that the second driving circuit 240 maintains the idle state. In this case, a leakage path is generated to the second pull-up transistor P32, which has been deteriorated by application of stress, thereby reducing the total off-current.

As set forth above, according to embodiments, the memory device may reduce the off-current caused by unused circuit(s) by accelerating the deterioration of certain types of transistors among unused circuit(s) when various configurations are implemented in one semiconductor chip. According to embodiments, the semiconductor device may reduce the off-current caused by unused circuit(s) by accelerating the deterioration of certain types of transistors among the circuit(s) present only for testing.

It should be noted that although the invention has been described in connection with various embodiments thereof, this is merely for description purposes and should not be interpreted as limiting. It should be appreciated by one of ordinary skill in the art that various changes may be made to any of the disclosed embodiments without departing from the technical spirit of the disclosure. For reference, in the case of a QDP-type chip, when a through electrode TSV is formed and packaged, but unused, a deterioration acceleration circuit described above may be implemented.

For example, for the logic gates and transistors provided as examples in the above-described embodiments may be of different types and arranged in different positions depending on the polarity of the input signal.

What is claimed is:

1. A semiconductor device, comprising:
a transmission circuit including a first transistor and a second transistor coupled in series between a first voltage terminal and a second voltage terminal, and a first common node coupled between the first transistor and the second transistor and coupled to a through line, the transmission circuit outputting a signal transferred from an internal circuit to the first common node according to an output control signal;
a reception circuit including a third transistor and a fourth transistor coupled in series between the first voltage terminal and the second voltage terminal, and a second common node coupled between the third transistor and the fourth transistor and coupled to the internal circuit, the reception circuit transferring a signal transferred through the through line to the internal circuit according to a first input control signal; and
a deterioration acceleration circuit for applying stress to the first and third transistors according to a test signal.

2. The semiconductor device of claim 1, wherein the deterioration acceleration circuit includes:
a first turn-on control circuit for controlling the output control signal to turn on the first transistor according to the test signal; and
a second turn-on control circuit for controlling the first input control signal to turn on the third transistor according to the test signal.

3. The semiconductor device of claim 1, wherein the semiconductor device includes a single die package type semiconductor chip or a double die package type semiconductor chip.

4. The semiconductor device of claim 1, wherein the transmission circuit includes:
a driving control circuit for generating a driving control signal by selecting a first transmission signal transferred from a first global line or a second transmission signal transferred from a second global line according to a selection signal; and
a driving circuit, including the first transistor and the second transistor, for driving the first common node by controlling the first transistor and the second transistor according to the driving control signal when the output control signal is enabled.

5. The semiconductor device of claim 4, wherein the deterioration acceleration circuit includes:
a first bias application circuit for fixing the driving control signal to a first level according to the test signal; and
a first turn-on control circuit for controlling the output control signal to turn on the first transistor according to the test signal.

6. The semiconductor device of claim 1, wherein the reception circuit includes:
a first receiver including the third transistor, the fourth transistor, and the second common node coupled between the third transistor and the fourth transistor and coupled to the internal circuit through a first global line, the first receiver transferring a signal transferred through the through line to the first global line according to the first input control signal; and
a second receiver including a fifth transistor and a sixth transistor, and a third common node coupled between the fifth transistor and the sixth transistor and coupled to an input/output circuit through a second global line, the second receiver transferring a signal transferred through the through line to the second global line according to a second input control signal.

7. The semiconductor device of claim 6, wherein the deterioration acceleration circuit includes:
a second bias application circuit for fixing the second common node and the third common node to a second level according to an inverted signal of the test signal;
a third bias application circuit for fixing the through line to the second level according to the inverted signal;
a second turn-on control circuit for controlling the first input control signal to turn on the third transistor according to the test signal; and a third turn-on control circuit for controlling the second input control signal to turn on the fifth transistor according to the test signal.

8. The semiconductor device of claim 6, wherein
the first transistor, the third transistor, and the fifth transistor are PMOS transistors, and wherein
the second transistor, the fourth transistor, and the sixth transistor are NMOS transistors.

9. A semiconductor device, comprising:
a first pull-up transistor and a first pull-down transistor coupled to a through line by a first common node and receiving a driving control signal transferred from a first global line or a second global line according to an output control signal to drive the first common node;
a second pull-up transistor and a second pull-down transistor coupled to the first global line by a second common node and receiving a signal transferred through the through line according to a first input control signal to drive the second common node;
a third pull-up transistor and a third pull-down transistor coupled to the second global line through a third common node and receiving a signal transferred through the through line according to a second input control signal to drive the third common node; and
a deterioration acceleration circuit for applying stress to the first to third pull-up transistors according to a test signal.

10. The semiconductor device of claim 9, wherein
the deterioration acceleration circuit includes:
a first turn-on control circuit for controlling the output control signal to turn on the first pull-up transistor according to the test signal;
a second turn-on control circuit for controlling the first input control signal to turn on the second pull-up transistor according to the test signal; and
a third turn-on control circuit for controlling the second input control signal to turn on the third pull-up transistor according to the test signal.

11. The semiconductor device of claim 10, further comprising:
a driving control circuit for generating the driving control signal by selecting a first transmission signal transferred from the first global line or a second transmission signal transferred from the second global line according to a selection signal.

12. The semiconductor device of claim 11, wherein
the deterioration acceleration circuit includes:
a first bias application circuit for fixing the driving control signal to a first level according to the test signal;
a second bias application circuit for fixing the second common node and the third common node to a second level according to an inverted signal of the test signal; and
a third bias application circuit for fixing the through line to the second level according to the inverted signal.

13. The semiconductor device of claim 9, wherein
the first to third pull-up transistors are PMOS transistors, and wherein
the first to third pull-down transistors are NMOS transistors.

14. The semiconductor device of claim 9, wherein
the semiconductor device includes a single die package type semiconductor chip or a double die package type semiconductor chip.

15. A method for operating a semiconductor device, the method comprising:
driving a first common node coupling a first pull up transistor and a first pull down transistor and also coupled to a through line, receiving a signal transferred through the through line, and driving a second common node coupling a second pull up transistor and a second pull down transistor and also coupled to a first global line, and receiving a signal transferred through the through line and driving a third common node coupling a third pull up transistor and a second pull down transistor and also coupled to a second global line;
performing a deterioration acceleration operation for applying a stress to the first to third pull-up transistors during a test operation; and
driving the first to third common nodes at a ground voltage level during a normal operation.

16. The method of claim 15, wherein
the semiconductor device includes a single die package type semiconductor chip or a double die package type semiconductor chip.

17. The method of claim 15, wherein
during the deterioration acceleration operation, a threshold voltage of the first to third pull-up transistors is increased, and deterioration of the first to third pull-up transistors is accelerated.

18. The method of claim 15, wherein
during the normal operation, a leakage path is formed in each of the first to third pull-up transistors and the first to third common nodes.

19. A semiconductor device, comprising:
a first driving circuit including a first transistor and a second transistor coupled in series between a first voltage terminal and a second voltage terminal, and a first common node coupled between the first transistor and the second transistor and coupled to a scheduled line, the first driving circuit transferring data transferred from a first pad group to the scheduled line according to a first driving control signal;
a second driving circuit including a third transistor and a fourth transistor coupled in series between the first voltage terminal and the second voltage terminal, and a second common node coupled between the third transistor and the fourth transistor and coupled to a scheduled line, the second driving circuit transferring data transferred from a second pad group to the scheduled line according to a second driving control signal; and
a deterioration acceleration circuit for applying a stress to the third transistor according to a test signal.

20. The semiconductor device of claim 19, wherein
a data width option of the semiconductor device is set to an x8 mode so that the second pad group includes a plurality of unused pads.

21. The semiconductor device of claim 19, wherein
the deterioration acceleration circuit includes:
a bias application circuit for fixing data transferred from the second pad group to a first level according to the test signal; and
a turn-on control circuit for controlling the second driving control signal to turn on the third transistor according to the test signal.

* * * * *